United States Patent
Ishimura et al.

(10) Patent No.: US 8,526,478 B2
(45) Date of Patent: Sep. 3, 2013

(54) SEMICONDUCTOR OPTICAL INTEGRATED ELEMENT

(75) Inventors: Eitaro Ishimura, Tokyo (JP); Kazuhisa Takagi, Tokyo (JP); Keisuke Matsumoto, Tokyo (JP); Takeshi Saito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 215 days.

(21) Appl. No.: 13/020,028

(22) Filed: Feb. 3, 2011

(65) Prior Publication Data

US 2011/0305255 A1 Dec. 15, 2011

(30) Foreign Application Priority Data

Jun. 10, 2010 (JP) .................................. 2010-133023

(51) Int. Cl.
*H01S 5/00* (2006.01)

(52) U.S. Cl.
USPC ............................................. 372/50.1

(58) Field of Classification Search
USPC .............. 372/38.02, 50.1, 75, 49.01; 438/28
See application file for complete search history.

(56) References Cited

U.S. PATENT DOCUMENTS

| 5,565,693 A | 10/1996 | Sasaki et al. |
| 5,801,872 A | 9/1998 | Tsuji |
| 7,593,445 B2 | 9/2009 | Sasada et al. |
| 2007/0297475 A1* | 12/2007 | Sasada et al. .............. 372/44.01 |

FOREIGN PATENT DOCUMENTS

| EP | 1 017 141 A2 | 7/2000 |
| JP | 05-323139 | * 12/1993 |
| JP | 6-260727 A | 9/1994 |
| JP | 7-74396 A | 3/1995 |
| JP | 8-78792 A | 3/1996 |
| JP | 8-220496 A | 8/1996 |
| JP | 2000-193921 A | 7/2000 |
| JP | 2007-227504 A | 9/2007 |
| JP | 2008-10484 A | 1/2008 |

OTHER PUBLICATIONS

C. Rolland et al.; "InGaAsP-based Mach-Zehnder Modulators for high speed transmission systems," *Proceedings of OFC '98 ThH1* (1998) 283-284.

* cited by examiner

*Primary Examiner* — Jessica Stultz
*Assistant Examiner* — Tuan Nguyen
(74) *Attorney, Agent, or Firm* — Leydig, Voit & Mayer, Ltd.

(57) ABSTRACT

A semiconductor optical integrated element includes: a substrate; and a laser diode and a modulator which are integrated on the substrate. The laser diode includes an embedded waveguide having a core layer, both sides of which are embedded in a semiconductor material. The modulator includes a high-mesa ridge waveguide having a core layer, neither side of which is embedded in the semiconductor material. The core layers in the laser diode and the modulator are stripe-shaped.

6 Claims, 11 Drawing Sheets

SEMICONDUCTOR OPTICAL INTEGRATED ELEMENT

BACKGROUND OF THE INVENTION

1. Field of the Invention

The present invention relates to a semiconductor optical integrated element and a method for manufacturing the same made up of a laser diode and a modulator integrated on a substrate.

2. Background Art

In recent years, semiconductor optical integrated elements made up of a laser diode and a modulator integrated on a substrate are used. Examples of adopted waveguide structures for a laser diode or modulator include an embedded waveguide in which both sides of a core layer are embedded with semiconductor, a high-mesa ridge waveguide in which both sides of a core layer are not embedded with semiconductor, and a low-mesa ridge waveguide whose groove does not reach a core layer (e.g., see Japanese Patent Laid-Open No. 2008-10484, Japanese Patent Laid-Open No. 6-260727, Japanese Patent Laid-Open No. 2007-227504 and C. Rolland et al., "InGaAsP-based Mach-Zehnder modulators for high speed transmission systems", Proceeding of OFC'98 ThH1 (1998)").

In conventional semiconductor optical integrated elements, the laser diode waveguide and the modulator waveguide have the same structure. When both waveguides are embedded waveguides, the laser diode demonstrates excellent heat radiation characteristics and good high output characteristics, whereas since the modulator has large light propagation loss and a large capacity, high output characteristics and high-speed modulation characteristics thereof deteriorate. When both waveguides are low-mesa ridge waveguides, heat radiation characteristics and high output characteristics deteriorate in the laser diode compared to the embedded waveguides, whereas in the modulator, the capacity increases and high-speed modulation characteristics thereof deteriorate. When both waveguides are high-mesa ridge waveguides, heat radiation characteristics in the laser diode significantly deteriorate compared to those of the embedded waveguides and high output characteristics cannot be obtained, whereas good high-speed modulation characteristics are obtained in the modulator because its capacity is small.

As such, there is no waveguide that satisfies both high output characteristics of the laser diode and high-speed modulation characteristics of the modulator. Thus, it is conceivable to use waveguides of different structures for the laser diode and the modulator. A tapered connection waveguide is proposed which connects waveguides of different structures (e.g., see Japanese Patent Laid-Open No. 2007-227504, Japanese Patent Laid-Open No. 7-74396, Japanese Patent Laid-Open No. 8-78792 and Japanese Patent Laid-Open No. 2000-193921).

SUMMARY OF THE INVENTION

However, in the conventional tapered connection waveguide, since its core layer of a high refractive index is also tapered, radiation loss at the connection between the laser diode and the modulator is large. Moreover, the core layer and the high-mesa ridge are misaligned due to limitation of superimposition accuracy of photoengraving, which may result in radiation loss.

In view of the above-described problems, an object of the present invention is to provide a semiconductor optical integrated element and a method for manufacturing the same which can reduce radiation loss in the connection between the laser diode and the modulator.

According to the present invention, a semiconductor optical integrated element comprises: a substrate; and a laser diode and a modulator which are integrated on the substrate, wherein the laser diode includes an embedded waveguide in which both sides of a core layer are embedded with semiconductor, the modulator includes a high-mesa ridge waveguide in which both sides of a core layer are not embedded with semiconductor, and the core layers in the laser diode and the modulator are stripe-shaped.

The present invention makes it possible to reduce radiation loss in the connection between the laser diode and the modulator.

Other and further objects, features and advantages of the invention will appear more fully from the following description.

DETAILED DESCRIPTION OF THE PREFERRED EMBODIMENTS

A semiconductor optical integrated element and a method for manufacturing the same according to the embodiments of the present invention will be described with reference to the drawings. The same components will be denoted by the same symbols, and the repeated description thereof may be omitted.

First Embodiment

Figure 1:
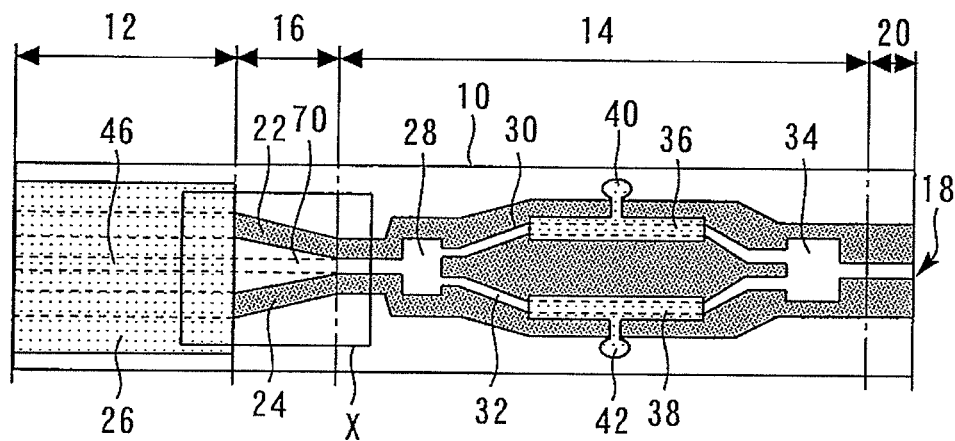
FIG. 1 is a top view illustrating a semiconductor optical integrated element according to a first embodiment.

FIG. 1 is a top view illustrating a semiconductor optical integrated element according to a first embodiment. A laser diode 12, a modulator 14, a connection waveguide 16 that guides light outputted from the laser diode 12 to the modulator 14 and a light output waveguide 20 that guides light outputted from the modulator 14 to a light output end face 18 are integrated on a single n-type InP substrate 10.

The laser diode 12 is a distributed feedback laser. A region of the laser diode 12 where a current is injected and the periphery of the chip are electrically separated by grooves 22 and 24. The laser diode 12 is provided with a p-electrode 26 (anode electrode).

The modulator 14 is a Mach-Zehnder (MZ) modulator provided with an optical demultiplexer 28, arms 30 and 32 and an optical multiplexer 34. The optical demultiplexer 28 and the optical multiplexer 34 are MMIs (multimode interferometers). The arms 30 and 32 are provided with electrodes 36 and 38 for applying a voltage and bonding pads 40 and 42 respectively.

Figure 2:
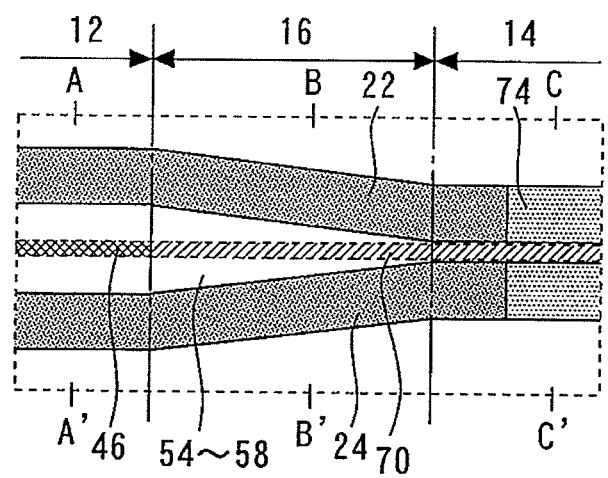
FIG. 2 is a top view showing an enlarged view of the region X of FIG. 1.
Figure 3:
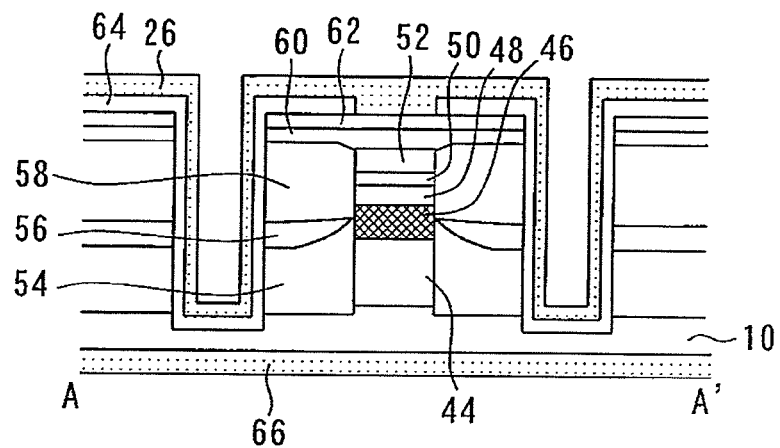
FIG. 3 is a cross-sectional view along A-A' of FIG. 2.
Figure 4:
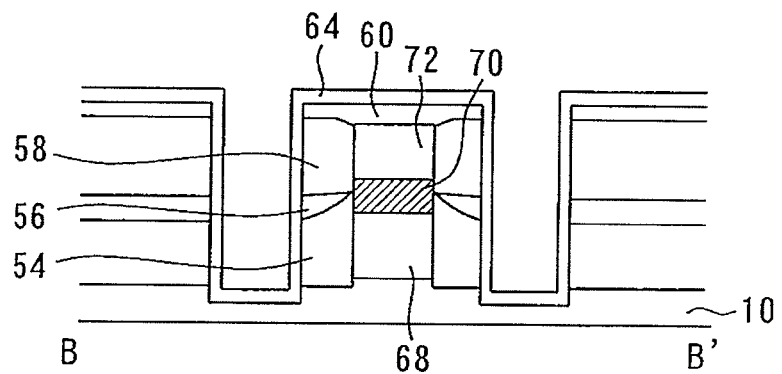
FIG. 4 is a cross-sectional view along B-B' of FIG. 2.
Figure 5:
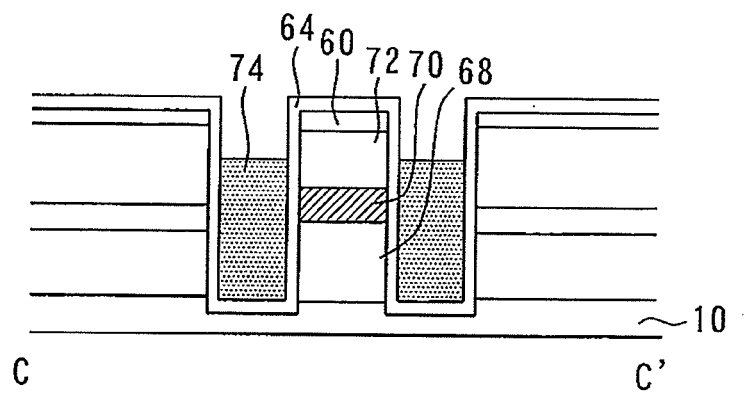
FIG. 5 is a cross-sectional view along C-C' of FIG. 2.

FIG. 2 is a top view showing an enlarged view of the region X of FIG. 1. FIG. 3 is a cross-sectional view along A-A' of FIG. 2, FIG. 4 is a cross-sectional view along B-B' of FIG. 2 and FIG. 5 is a cross-sectional view along C-C' of FIG. 2.

In the laser diode 12, an n-type InP clad layer 44, a core layer 46, a p-type InP clad layer 48, a diffraction grating 50 and a p-type InP clad layer 52 are laminated on the n-type InP substrate 10 and these are patterned in a stripe shape. Both sides of the core layer 46 are embedded with a p-type InP layer 54, an n-type InP layer 56 and an Fe-doped InP layer 58 (semiconductor) having greater band gap energy than that of the core layer 46. Thus, the laser diode 12 adopts an embedded waveguide in which both sides of the core layer 46 are embedded with semiconductor.

Furthermore, a p-type InP clad layer 60 and a p-type contact layer 62 are laminated on the p-type InP clad layer 52 and the Fe-doped InP layer 58. The grooves 22 and 24 are formed in the embedded layer. The whole surface is protected by a passivation film 64. A p-electrode 26 is connected to the p-type contact layer 62 via an opening of the passivation film 64. An n-electrode 66 (cathode electrode) is connected to the underside of the n-type InP substrate 10.

In the modulator 14, an n-type InP clad layer 68, a core layer 70 and a p-type InP clad layer 72 are laminated on the n-type InP substrate 10 and these are patterned in a stripe shape. Both sides of the core layer 70 are protected by the passivation film 64 and the outside thereof is embedded with a material other than semiconductor such as air or polyimide 74 or the like. Thus, the modulator 14 adopts a high-mesa ridge waveguide in which both sides of the core layer 70 are not embedded with semiconductor.

In the connection waveguide 16, the n-type InP clad layer 68, core layer 70 and p-type InP clad layer 72 are laminated on the n-type InP substrate 10 and these are patterned in a stripe shape. Both sides of the core layer 70 are embedded with the p-type InP layer 54, n-type InP layer 56 and Fe-doped InP layer 58 (semiconductor) having lower refractive indexes than that of the core layer 70. Thus, the connection waveguide 16 adopts an embedded waveguide in which both sides of the core layer 70 are embedded with semiconductor.

Here, the core layer 46 of the laser diode 12 is an active layer, the core layer 70 of the modulator 14 is a modulation layer and the core layer 70 of the connection waveguide 16 is a light propagation layer through which light propagates. The core layers 46 and 70 are sandwiched by upper and lower clad layers having smaller refractive indexes than those of the core layers 46 and 70. Therefore, light propagates while being trapped in the vicinity of the core layers 46 and 70.

Furthermore, the width of the laser diode 12 is defined by the distance between the two grooves 22 and 24 in the laser diode 12. To be more specific, the width of the laser diode 12 is 4 μm or more. The width of the connection waveguide 16 is defined by the distance between the two grooves 22 and 24 in the connection waveguide 16 and becomes narrower in the direction from the laser diode 12 to the modulator 14. To be more specific, the width of the connection waveguide 16 changes from 3.5 μm to 1.5 μm. The length of the connection waveguide 16 is 50 μm to 1 mm, for example, 100 μm. The length of the connection waveguide 16 is preferably 100 μm or less from the standpoint of optical loss.

Furthermore, as a feature of the present embodiment, the core layers 46 and 70 in the laser diode 12, connection waveguide 16 and modulator 14 are stripe-shaped and have the same width. To be more specific, the widths of the core layers 46 and 70 are 1 to 3 μm, for example, 1.5 μm.

Next, operations of the above described semiconductor optical integrated element will be described. When a forward current is passed through the laser diode 12, laser oscillation occurs and laser light is emitted from the laser diode 12. The light propagates through the connection waveguide 16, is impinged on the optical demultiplexer 28 of the modulator 14, divided by two by the optical demultiplexer 28 and the respective laser beams propagate through the arms 30 and 32. Furthermore, the laser beams that have passed through the arms 30 and 32 are multiplexed by the optical multiplexer 34, the multiplexed laser beam propagates through the light output waveguide 20 and is outputted from the light output end face 18.

The modulator 14 can modulate laser light by changing the optical length of the waveguides of the arms 30 and 32 with a variation in refractive index accompanying application of a voltage. To be more specific, when voltages of different magnitudes are applied to the electrodes 36 and 38 of the modulator 14, the refractive indexes of the arms 30 and 32 have different values. Assuming the difference between the refractive indexes is Δn, the length of portions of the arms 30 and 32 to which a voltage is applied is L and the wavelength of light that propagates through the arms 30 and 32 is λ, a phase difference $\Delta\phi = \Delta n \cdot L \cdot 2\pi/\lambda$ is generated in the light that has passed through the arms 30 and 32.

When the phase difference Δφ satisfies nπ (n is 0 or an even number), the light that has passed through the arms 30 and 32 reinforce each other at the optical multiplexer 34. On the other hand, when the phase difference Δφ satisfies kπ (k is an odd number), the light that has passed through the arms 30 and 32 cancel out each other at the optical multiplexer 34. Thus, the intensity of light can be modulated by the voltage applied to the arms 30 and 32. Furthermore, when a modulation voltage is applied to the modulator 14 so that the phase difference Δφ cycles between the state of nπ and the state of (n+2)π, it is possible to realize phase modulation of light.

Next, effects of the first embodiment will be described. Since the laser diode 12 adopts the embedded waveguide, the laser diode 12 has excellent heat radiation characteristics and demonstrates excellent high output characteristics. Moreover, the thermal resistance of the embedded waveguide is as low as several tens of ° C./W, and is equal to or less than half the thermal resistance of a high-mesa ridge waveguide embedded with an organic material such as polyimide or glass-based material. Therefore, even if an operating current of 100 mA or more is passed through the core layer 46, heat saturation of optical output or the like never occurs. Furthermore, if both sides of the core layer 46 are embedded with high quality semiconductor crystal, deterioration on both sides of the core layer 46 is suppressed and high reliability can be achieved. If both sides of the core layer 46 are embedded with polyimide or the like, surface recoupling occurs and the efficiency also deteriorates.

Furthermore, the modulator 14 adopts a high-mesa ridge waveguide. Since semiconductor with large optical or microwave loss does not exist on both sides of the core layer 70 in the high-mesa ridge waveguide, the high-mesa ridge waveguide demonstrates low loss with respect to light and microwave. Furthermore, since its electric capacity is small, high-speed modulation is possible.

Furthermore, the width of the connection waveguide 16 decreases in the direction from the laser diode 12 to the modulator 14. Therefore, the plane shape of the connection waveguide 16 is tapered and the embedded waveguide is changed to the high-mesa ridge waveguide in the connection waveguide 16. However, the core layer 70 of the connection waveguide 16 is stripe-shaped and its width is substantially constant. That is, the widths of the embedded layers on both sides are changed without changing the width of the core layer 70 of the connection waveguide 16. Therefore, the core layers 46 and 70 in the laser diode 12, connection waveguide 16 and modulator 14 are stripe-shaped and have the same width. It is therefore possible to reduce radiation loss in the connection between the laser diode 12 and the modulator 14. The light propagation efficiency from the laser diode 12 to the modulator 14 is calculated to be 100%.

Instead of the n-type InP substrate 10, a p-type InP substrate or semi-insulating InP substrate may be used. However, when an n-type InP substrate is used, the upside is p-type semiconductor and electric isolation between the laser diode 12 and the modulator 14 is higher than when a p-type InP substrate is used. Furthermore, a traveling wave type electrode may be used for the modulator 14. However, in such a case, it is essential that microwave loss be small in particular.

Furthermore, the core layer 46 of the laser diode 12 is an AlGaInAs-based or InGaAsP-based multiple quantum well and its band gap wavelength is 1.2 to 1.62 μm. The core layers 70 of the arms 30 and 32 of the modulator 14 are AlGaInAs-based or InGaAsP-based multiple quantum wells and their band gap wavelength is 1 to 1.55 μm. That is, the band gap wavelength of the core layer 70 is made to be shorter than the oscillating wavelength of the laser diode 12. Besides the arms 30 and 32 of the modulator 14, the core layers 70 of the connection waveguide 16 and the light output waveguide 20 may be the same multiple quantum wells as those of the core layers 70 of the arms 30 and 32 or AlGaInAs-based or InGaAsP-based bulk or multiple quantum wells whose band gap wavelength is shorter than the oscillating wavelength of the laser diode 12 may be formed separately. The core layers 46 and 70 may be made to selectively grow or may be made to grow separately through Butt-joint growth and then connected together.

Furthermore, in the laser diode 12, connection waveguide 16 and modulator 14, the depths of the grooves 22 and 24 may be changed respectively. For example, suppose the depth of the grooves 22 and 24 in the laser diode 12 is 7 μm, the depth of the grooves 22 and 24 in the connection waveguide 16 is 5 μm and the depth of the grooves 22 and 24 in the modulator 14 is 4 μm.

Furthermore, to reduce optical loss, carrier concentration of the upper layer or lower layer of the core layer of the connection waveguide 16 may be set to as low as 1E17 cm$^{-3}$ or less or both the upper and lower layers may be of n-type with less optical loss.

Furthermore, the p-type contact layer 62 is preferably not provided in the connection waveguide 16. This reduces optical loss and also increases isolation resistance between the laser diode 12 and the modulator 14.

Second Embodiment

Figure 6:
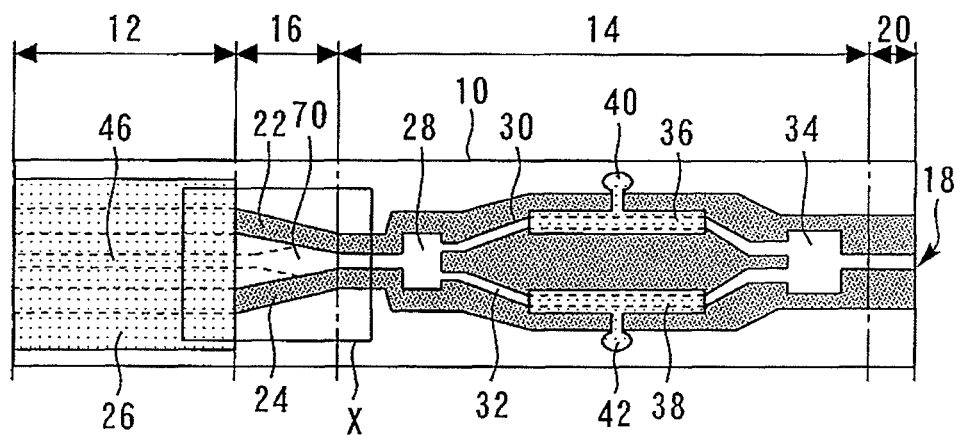
FIG. 6 is a top view illustrating a semiconductor optical integrated element according to a second embodiment.
Figure 7:
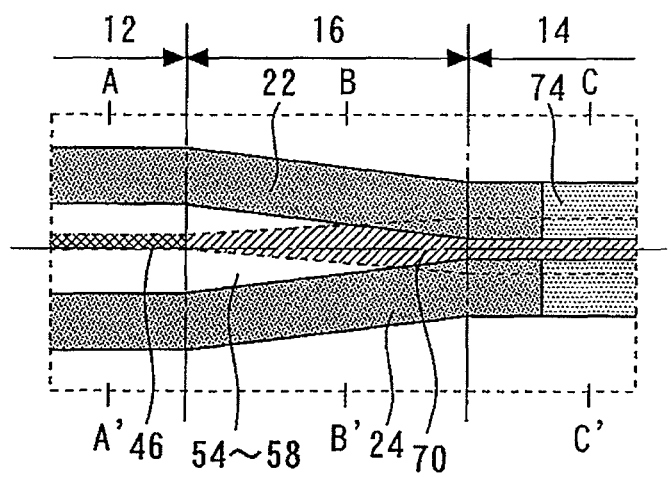
FIG. 7 is a top view showing an enlarged view of the region X of FIG. 6.
Figure 8:
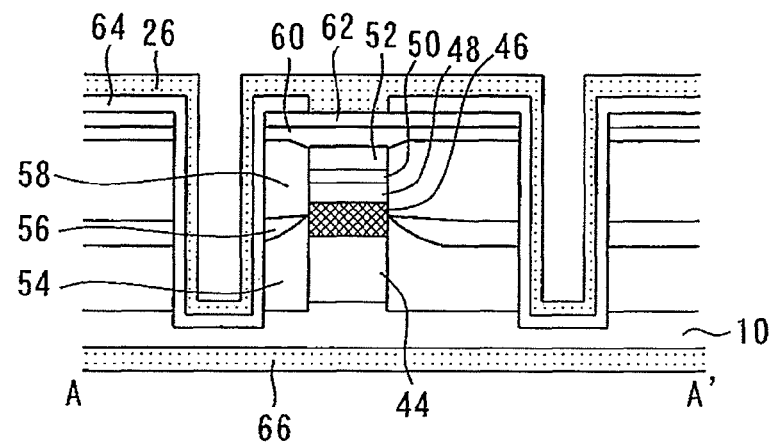
FIG. 8 is a cross-sectional view along A-A' of FIG. 7.
Figure 9:
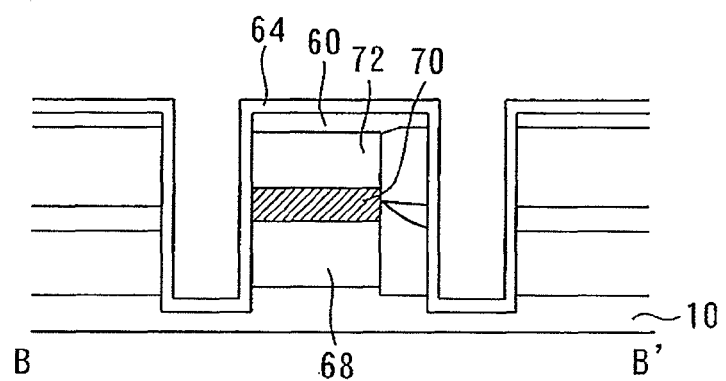
FIG. 9 is a cross-sectional view along B-B' of FIG. 7.
Figure 10:
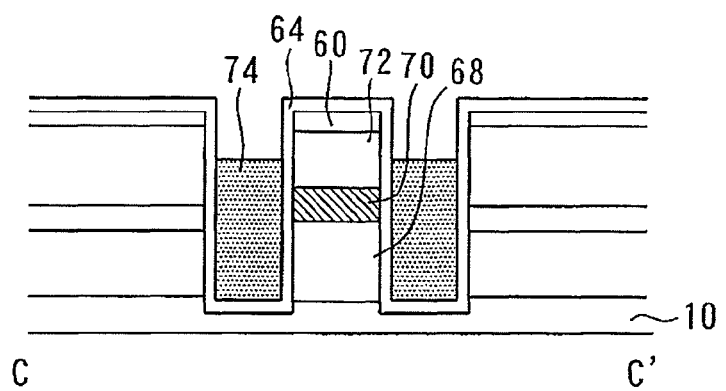
FIG. 10 is a cross-sectional view along C-C' of FIG. 7.

FIG. 6 is a top view illustrating a semiconductor optical integrated element according to a second embodiment. FIG. 7 is a top view showing an enlarged view of the region X of FIG. 6. FIG. 8 is a cross-sectional view along A-A' of FIG. 7, FIG. 9 is a cross-sectional view along B-B' of FIG. 7 and FIG. 10 is a cross-sectional view along C-C' of FIG. 7. In the second embodiment, the width of the core layer 70 in the connection waveguide 16 increases in the direction from the laser diode 12 to the modulator 14.

Figure 11:
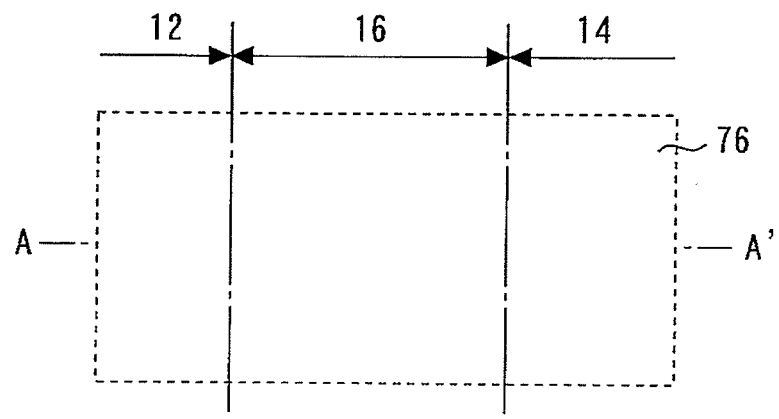
FIG. 11 is a top views for explaining a method for manufacturing a semiconductor optical integrated element according to a second embodiment.
Figure 12:
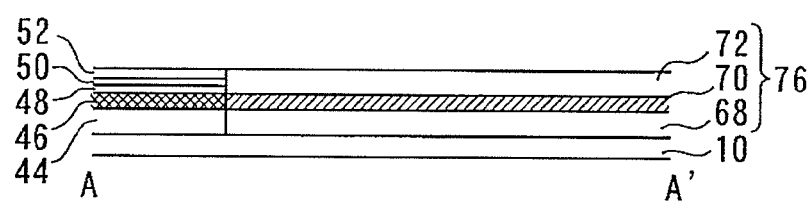
FIG. 12 is a cross-sectional view along A-A' of FIG. 11.
Figure 13:
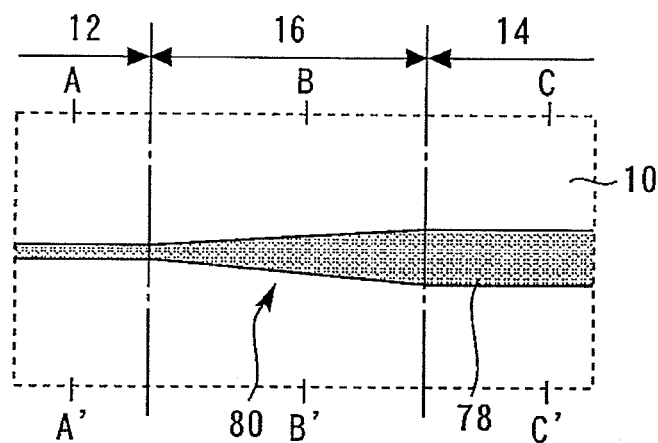
FIG. 13 is a top views for explaining a method for manufacturing a semiconductor optical integrated element according to a second embodiment.
Figure 14:
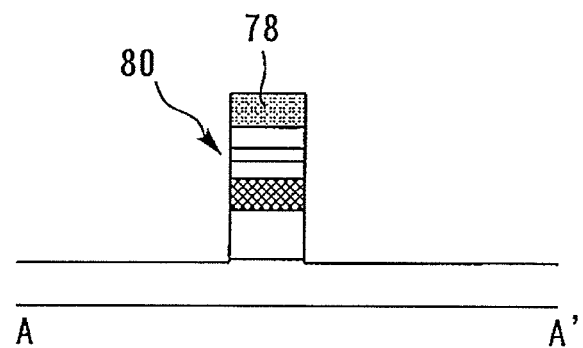
FIG. 14 is a cross-sectional view along A-A' of FIG. 13.
Figure 15:
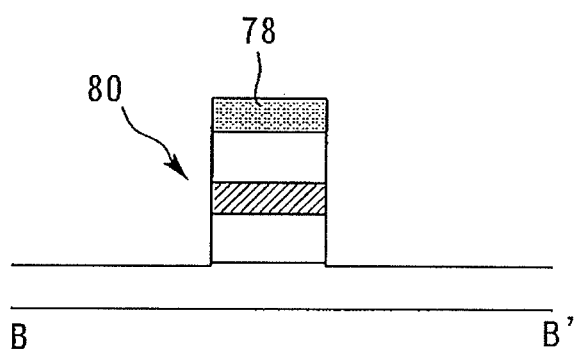
FIG. 15 is a cross-sectional view along B-B' of FIG. 13.
Figure 16:
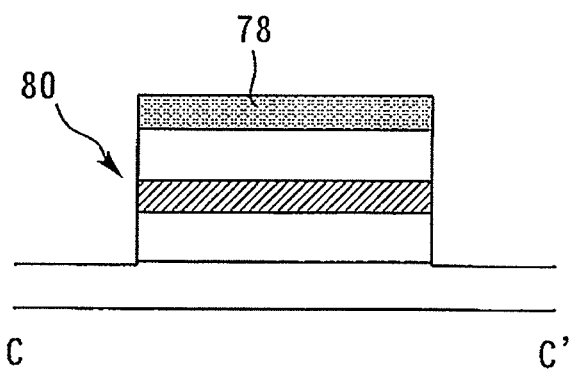
FIG. 16 is a cross-sectional view along C-C' of FIG. 13.

Next, a method for manufacturing the semiconductor optical integrated element according to the second embodiment will be described. First, as shown in FIG. 11 and FIG. 12, a semiconductor laminated structure 76 having the core layers 46 and 70 on the n-type InP substrate 10 is formed first. The semiconductor laminated structure 76 is made by laminating the n-type InP clad layer 44, the core layer 46, the p-type InP clad layer 48, the diffraction grating 50 and the p-type InP clad layer 52 on the n-type InP substrate 10 in a region where the laser diode 12 is formed and by laminating the n-type InP clad layer 68, the core layer 70 and the p-type InP clad layer 72 on the n-type InP substrate 10 in a region where the modulator 14 and the connection waveguide 16 are formed.

Next, as shown in FIG. 13 to FIG. 16, the semiconductor laminated structure 76 is patterned to form a ridge structure 80 using an insulating film 78 as a mask. The ridge structure 80 in the region where the laser diode 12 and the modulator 14 are formed is stripe shaped. However, the width of the ridge structure 80 in the region in which the laser diode 12 is formed is narrower than the width of the ridge structure 80 in the region in which the modulator 14 is formed. Furthermore, the width of the ridge structure 80 in the region in which the connection waveguide 16 is formed increases in the direction from the laser diode 12 to the modulator 14.

Figure 17:
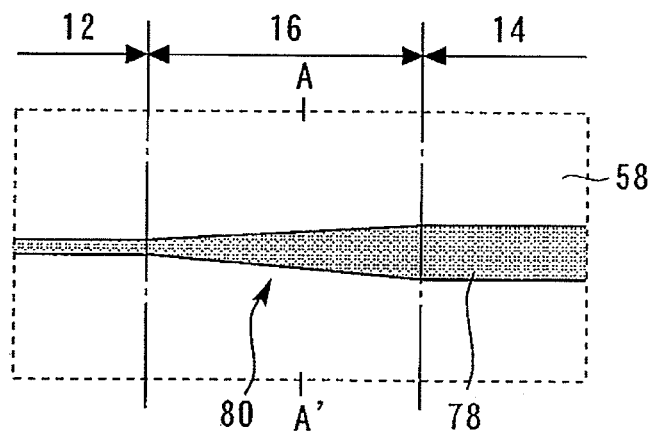
FIG. 17 is a top views for explaining a method for manufacturing a semiconductor optical integrated element according to a second embodiment.
Figure 18:
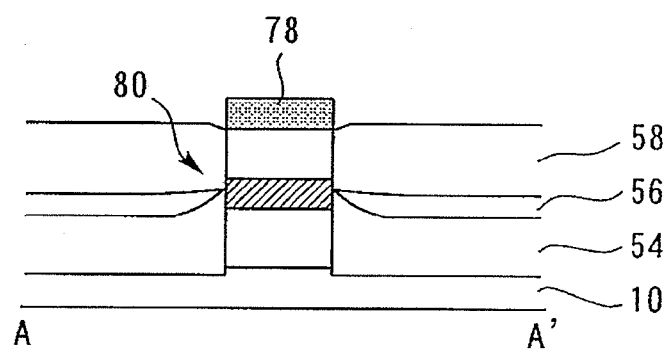
FIG. 18 is a cross-sectional view along A-A' of FIG. 17.
Figure 19:
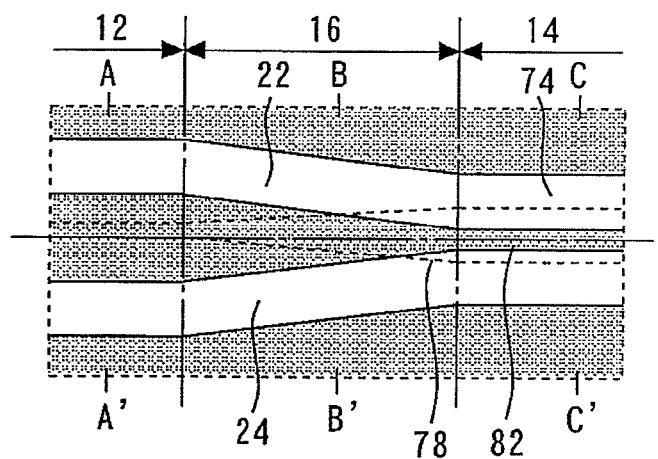
FIG. 19 is a top views for explaining a method for manufacturing a semiconductor optical integrated element according to a second embodiment.
Figure 20:
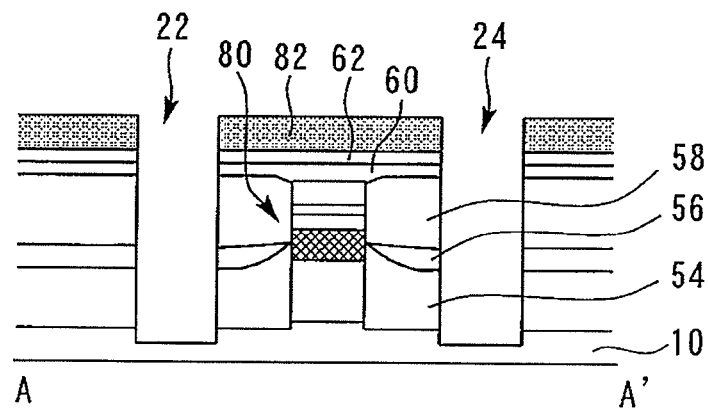
FIG. 20 is a cross-sectional view along A-A' of FIG. 19.
Figure 21:
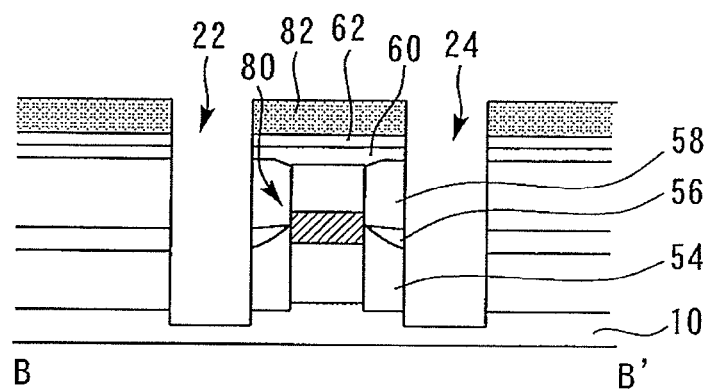
FIG. 21 is a cross-sectional view along B-B' of FIG. 19.
Figure 22:
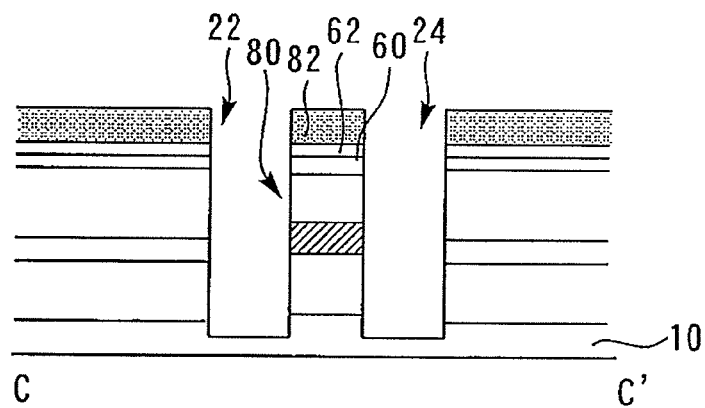
FIG. 22 is a cross-sectional view along C-C' of FIG. 19.

Next, as shown in FIG. 17 and FIG. 18, both sides of the ridge structure 80 are embedded with the p-type InP layer 54, the n-type InP layer 56 and the Fe-doped InP layer 58. After that, the insulating film 78 is removed, and the p-type InP clad layer 60 and the p-type contact layer 62 are laminated.

Next, as shown in FIG. 19 to FIG. 22, the ridge structure 80, p-type InP layer 54, n-type InP layer 56 and Fe-doped InP layer 58 are etched using the insulating film 82 as a mask to form grooves 22 and 24. In this way, the laser diode 12, modulator 14 and connection waveguide 16 are formed. In this case, it is necessary to ensure that the laser diode 12 and connection waveguide 16 become embedded waveguides and the modulator 14 becomes a high-mesa ridge waveguide. It is also necessary to ensure that the width of the connection waveguide 16 becomes narrower in the direction from the laser diode 12 to the modulator 14. For example, the width of the connection waveguide 16 changes from 3.5 μm to 1.5 μm. On the other hand, the width of the ridge structure 80 in the region where the connection waveguide 16 is formed changes from 1.5 μm to 3.5 μm.

Figure 23:
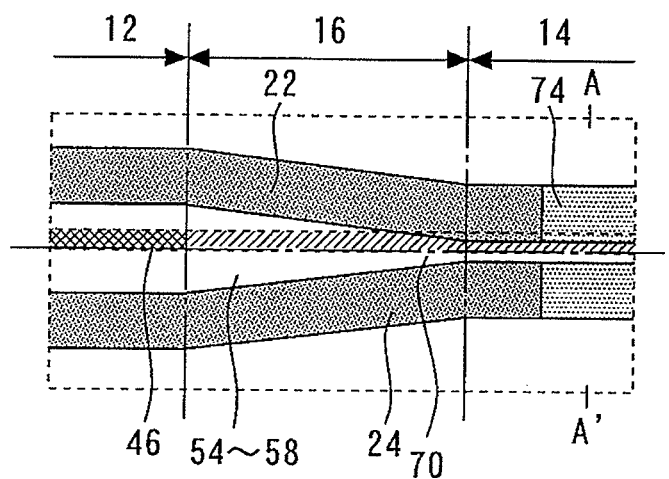
FIG. 23 is a top view illustrating a semiconductor optical integrated element according to a comparative example.
Figure 24:
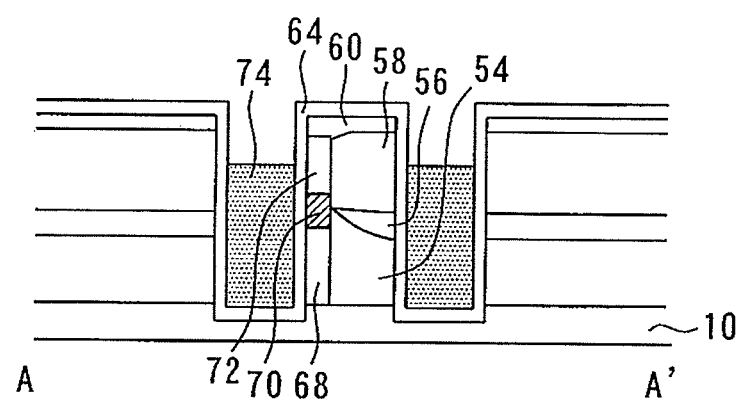
FIG. 24 is a cross-sectional view along A-A' of FIG. 23.

Next, effects of the second embodiment will be described in comparison with a comparative example. FIG. 23 is a top view illustrating a semiconductor optical integrated element according to a comparative example. FIG. 24 is a cross-sectional view along A-A' of FIG. 23. In the comparative example as in the first embodiment, the core layer 70 of the connection waveguide 16 is stripe-shaped and its width is constant.

Here, the position accuracy of the core layers 46 and 70 and the position accuracy of the high-mesa ridge waveguide of the modulator 14 between the grooves 22 and 24 are determined by accuracy of photoengraving. However, due to limitation of superimposition accuracy of photoengraving, the center of the core layer 70 is often deviated from the center of the high-mesa ridge waveguide by on the order of 1 μm. For this reason, in the comparative example, only part of the core layer 70 remains in the modulator 14 and it is more difficult for light to propagate and radiation loss occurs.

On the other hand, in the second embodiment, the width of the core layer 70 of the connection waveguide 16 increases in the direction from the laser diode 12 to the modulator 14. Therefore, even when the center of the core layer 70 is deviated from the center of the high-mesa ridge waveguide, the entire core layer 70 fits within the modulator 14. For this reason, it is possible to reduce radiation loss in the connection between the laser diode 12 and the modulator 14.

For example, assuming that both the width of the core layer 46 of the laser diode 12 and the width of the modulator 14 are 1.5 μm, if the core layer 70 is widened from 1.5 μm to 3.5 μm within the connection waveguide 16, even when the center of the core layer 70 deviates from the center of the high-mesa ridge waveguide by ±1 μm, the entire core layer 70 fits within the modulator 14. The width of the core layer 70 widens to 1.5 μm or more within the connection waveguide 16, but it has been confirmed through simulation and actual measurement that light propagates in a basic mode. On the other hand, when the widths of the core layers 46 and 70 are uniformly set to 3.5 μm, light is transformed into a high-order mode within the embedded waveguide of the laser diode 12.

Third Embodiment

Figure 25:
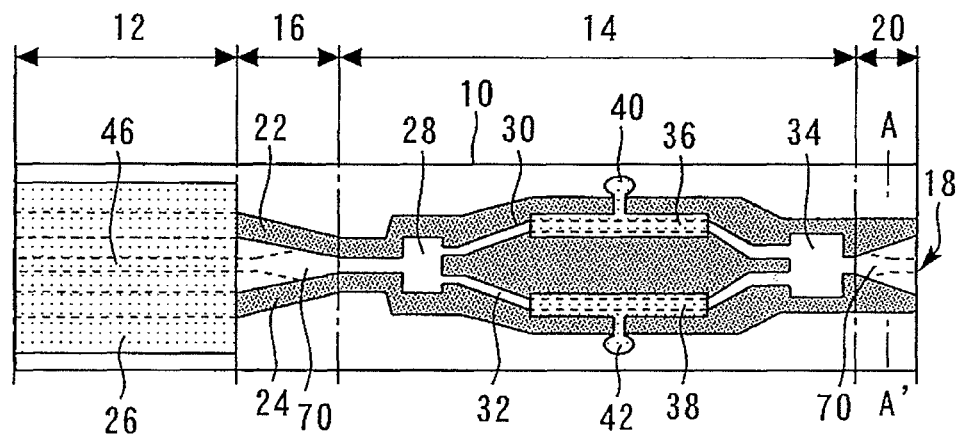
FIG. 25 is a top view illustrating a semiconductor optical integrated element according to a third embodiment.
Figure 26:
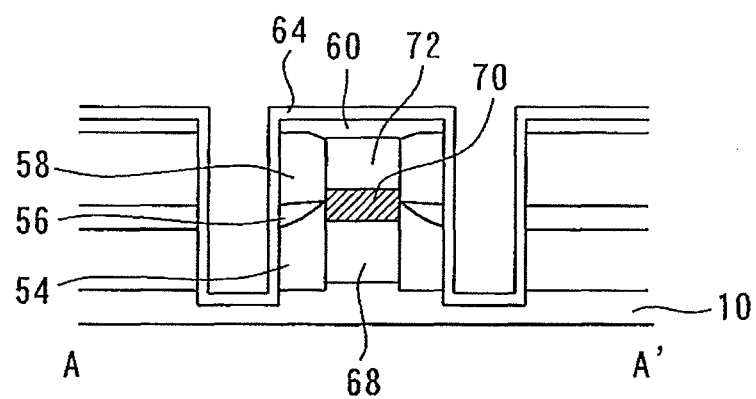
FIG. 26 is a cross-sectional view along A-A' of FIG. 25.

FIG. 25 is a top view illustrating a semiconductor optical integrated element according to a third embodiment. FIG. 26 is a cross-sectional view along A-A' of FIG. 25. As the light output waveguide 20, the third embodiment adopts an embedded waveguide in which both sides of the core layer 70 are embedded with semiconductor. The width of the light output waveguide 20 is defined by the distance between the two grooves 22 and 24 in the light output waveguide 20 and increases in the direction from the modulator 14 to the light output end face 18. Furthermore, the width of the core layer 70 of the light output waveguide 20 decreases in the direction from the modulator 14 to the light output end face 18.

The high-mesa ridge waveguide has a large amount of light trapped, and therefore the angle of emergence of light widens. Thus, by re-transforming the high-mesa ridge waveguide into an embedded waveguide as in the present embodiment, the waveguide becomes an embedded waveguide at the light output end face 18, and it is thereby possible to narrow the angle of emergence of light.

Figure 27:
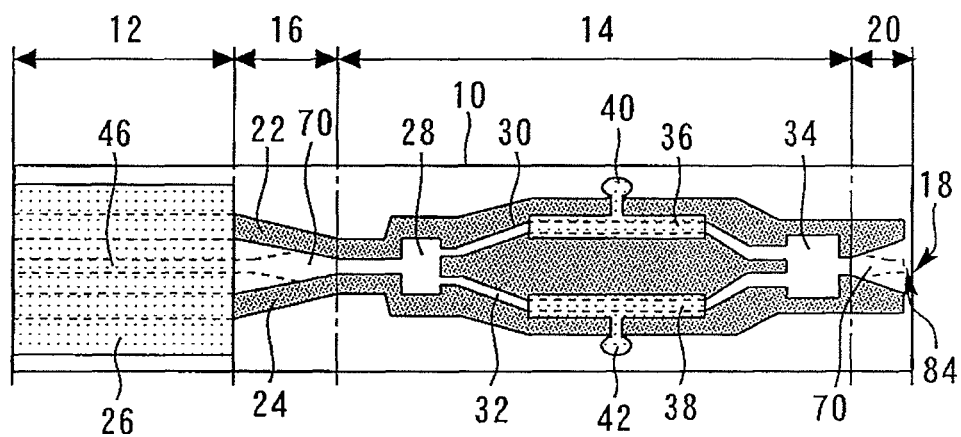
FIG. 27 is a top view illustrating a modification example of the semiconductor optical integrated element according to the third embodiment.

FIG. 27 is a top view illustrating a modification example of the semiconductor optical integrated element according to the third embodiment. In the modification example, the light output waveguide 20 includes a window structure 84 in which the core layer 70 ends off in the vicinity of the light output end face 18. The window structure 84 can reduce reflection returning light from the light output end face 18. Moreover, compared to the case where a window structure is directly added to a high-mesa ridge waveguide, the amount of light trapped in the vicinity of the light output end face 18 is smaller. This causes tolerance to variations in the length of the window structure 84 to increase, and therefore even when the length of the window structure 84 varies by on the order of ±20 μm due to cleavage accuracy, it is possible to stably extract light.

Fourth Embodiment

Figure 28:
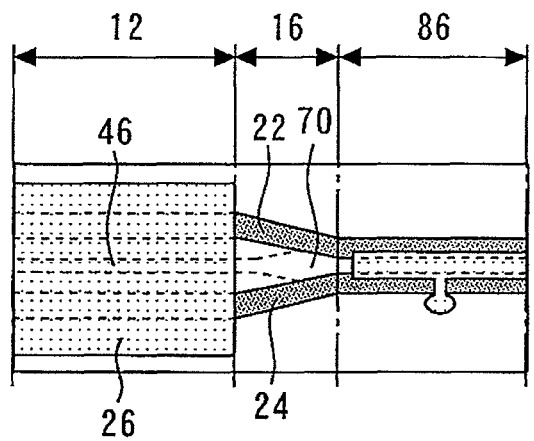
FIG. 28 is a top view illustrating a semiconductor optical integrated element according to a fourth embodiment.

FIG. 28 is a top view illustrating a semiconductor optical integrated element according to a fourth embodiment. The fourth embodiment uses an electric field absorption type modulator 86 as the modulator. As in the case of the second embodiment, the width of the core layer 70 of the connection waveguide 16 increases in the direction from the laser diode 12 to the modulator 86. Thus, it is possible to reduce radiation loss at the connection between the laser diode 12 and the modulator 86 as in the case of the second embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-133023, filed on Jun. 10, 2010 including specification, claims, drawings and summary, on which the Convention priority of the present application is based, are incorporated herein by reference in its entirety.

What is claimed is:
1. A semiconductor optical integrated element comprising:
a substrate having a surface;
a laser diode integrated on the surface of the substrate and comprising a laser diode mesa having sides transverse to the surface of the semiconductor substrate, wherein
the laser diode mesa includes cladding layers and a laser diode core layer having sides exposed at the sides of the laser diode mesa,
the laser diode core layer is sandwiched between the cladding layers of the laser diode, and
the cladding layers of the laser diode and the laser diode core layer are stacked on the semiconductor substrate in the laser diode mesa;
a connection waveguide integrated on the surface of the substrate and comprising a connection waveguide mesa having sides transverse to the surface of the semiconductor substrate, wherein
the connection waveguide mesa includes cladding layers and a connection waveguide core layer having sides exposed at the sides of the connection waveguide mesa,
the connection waveguide core layer is sandwiched between the cladding layers of the connection waveguide, and the cladding layers of the connection waveguide and the connection waveguide core layer are stacked on the semiconductor substrate in the connection waveguide mesa;

a modulator integrated on the surface of the substrate and comprising a modulator mesa having sides transverse to the surface of the semiconductor substrate, wherein the modulator mesa includes cladding layers and a modulator core layer having sides exposed at the sides of the modulator mesa, the modulator core layer is sandwiched between the cladding layers of the modulator, and the cladding layers of the modulator and the modulator core layer are stacked on the semiconductor substrate in the modulator mesa, the laser diode, the connection waveguide, and the modulator are optically serially connected and integrated so that light generated in the laser diode and output from the laser diode core layer is guided to the modulator core layer of the modulator through the core layer of the connection waveguide;

at least one semiconductor material, having a larger bandgap energy than bandgap energies of the laser diode core layer and the connection waveguide core layer, covering and embedding the sides of the laser diode core layer and the sides of the connection waveguide core layer at the sides of the laser diode mesa and the connection waveguide mesa; and a passivation film covering and embedding the sides of the modulator core layer at the sides of the modulator mesa, wherein the laser diode core layer and of the modulator core layer are stripe-shaped.

2. The semiconductor optical integrated element according to claim 1, wherein the connection waveguide has a width transverse to a direction of propagation of light from the laser diode to the modulator, the width of the connection waveguide decreases in the direction of the propagation of light from the laser diode to the modulator, and the connection waveguide core layer is stripe-shaped.

3. The semiconductor optical integrated element according to claim 1, wherein the connection waveguide has a width transverse to a direction of propagation of light from the laser diode to the modulator, the width of the connection waveguide decreases in the direction of the propagation of light from the laser diode to the modulator, the connection waveguide core layer has a width in the direction of the propagation of light from the laser diode to the modulator, and the width of the connection waveguide core layer in the connection waveguide increases in the direction of the propagation of light from the laser diode to the modulator.

4. The semiconductor optical integrated element according to claim 1, further comprising a light output waveguide integrated on the surface of the substrate and guiding light output from the modulator to a light output end face of the semiconductor optical integrated element, wherein the light output waveguide comprises a light output waveguide mesa having sides transverse to the surface of the semiconductor substrate, the light output waveguide mesa includes cladding layers and a light output waveguide core layer having sides exposed at the sides of the light output waveguide mesa, the light output waveguide core layer is sandwiched between the cladding layers of the light output waveguide, the cladding layers of the light output waveguide and the light output waveguide core layer are stacked on the semiconductor substrate in the light output waveguide mesa, the at least one semiconductor material covers and embeds the sides of light output waveguide core layer at the sides of the light output waveguide mesa, the light output waveguide has a width transverse to a direction of propagation of light from the modulator to the light output end face, the width of the light output waveguide increases in the direction of propagation of light from the modulator to the light output end face, and the width of the light output waveguide core layer decreases in the direction of propagation of light from the modulator to the light output end face.

5. The semiconductor optical integrated element according to claim 4, wherein the light output waveguide includes a window structure in which the light output waveguide core layer ends proximate the light output end face.

6. The semiconductor optical integrated element according to claim 1, wherein the passivation film is embedded by one of air and polyimide.

* * * * *